United States Patent
Lee et al.

(10) Patent No.: US 12,276,704 B2
(45) Date of Patent: Apr. 15, 2025

(54) MAXIMUM DISCHARGE CURRENT PREDICTION METHOD AND BATTERY SYSTEM USING THE SAME

(71) Applicant: LG ENERGY SOLUTION, LTD., Seoul (KR)

(72) Inventors: Sun Jong Lee, Daejeon (KR); Cheoltaek Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 161 days.

(21) Appl. No.: 18/012,462

(22) PCT Filed: Dec. 23, 2021

(86) PCT No.: PCT/KR2021/019712
§ 371 (c)(1),
(2) Date: Dec. 22, 2022

(87) PCT Pub. No.: WO2022/149769
PCT Pub. Date: Jul. 14, 2022

(65) Prior Publication Data
US 2023/0266402 A1 Aug. 24, 2023

(30) Foreign Application Priority Data
Jan. 8, 2021 (KR) .......... 10-2021-0002662

(51) Int. Cl.
*G01R 31/396* (2019.01)
*G01R 31/367* (2019.01)
(Continued)

(52) U.S. Cl.
CPC ......... *G01R 31/396* (2019.01); *G01R 31/367* (2019.01); *G01R 31/3842* (2019.01);
(Continued)

(58) Field of Classification Search
CPC .......... G01R 31/396; G01R 31/367; G01R 31/3842; G01R 19/16542; G01R 31/389;
(Continued)

(56) References Cited

U.S. PATENT DOCUMENTS

| 5,614,829 A | 3/1997 | Song |
| 9,885,760 B2 * | 2/2018 | Kosugi ............... G01R 31/392 |

(Continued)

FOREIGN PATENT DOCUMENTS

| JP | H09-329652 A | 12/1997 |
| JP | 2004-301784 A | 10/2004 |

(Continued)

OTHER PUBLICATIONS

International Search Report (with partial translation) and Written Opinion dated Apr. 4, 2022, issued in corresponding International Application No. PCT/KR2021/019712.

(Continued)

*Primary Examiner* — Daniel R Miller
(74) *Attorney, Agent, or Firm* — MORGAN, LEWIS & BOCKIUS LLP

(57) ABSTRACT

A method of predicting a maximum discharge current for a battery cell includes: receiving a discharge time and a discharge limitation voltage; setting a discharge reference voltage; obtaining a proportional constant and an index parameter corresponding to the discharge reference voltage, wherein the proportional constant and the index parameter are applied to a relation between a constant current and a discharge time during a discharge; calculating a constant current for the discharge time by using the proportional constant and the index parameter; and adjusting the discharge reference voltage when a difference between a temporary discharge limitation voltage at which a voltage due to the constant current and an internal resistance of the battery (Continued)

cell is dropped from the discharge reference voltage and the discharge limitation voltage deviates from a predetermined error.

16 Claims, 7 Drawing Sheets

(51) Int. Cl.
    *G01R 31/3842*    (2019.01)
    *H01M 10/48*    (2006.01)
    *H02J 7/00*    (2006.01)
    *H01M 10/42*    (2006.01)

(52) U.S. Cl.
    CPC ....... *H01M 10/482* (2013.01); *H01M 10/486* (2013.01); *H02J 7/0047* (2013.01); *H01M 2010/4271* (2013.01); *H02J 7/007182* (2020.01)

(58) Field of Classification Search
    CPC .............................. G01R 31/386; G01R 19/10; G01R 19/16566; G01R 31/3648; G01R 31/382; G01R 31/387; G01R 31/392; H01M 10/482; H01M 10/486; H01M 2010/4271; H01M 10/052; H01M 10/42; H01M 10/425; H01M 10/4285; H01M 10/0525; H01M 10/48; H02J 7/0047; H02J 7/007182; Y02E 60/10; B60R 16/033
See application file for complete search history.

(56) References Cited

U.S. PATENT DOCUMENTS

| | | |
|---|---|---|
| 10,523,022 B2 | 12/2019 | Yen |
| 2004/0000892 A1 | 1/2004 | Jae-Seung |
| 2005/0035742 A1* | 2/2005 | Koo ................... G01R 31/3842 |
| | | 320/149 |
| 2005/0110498 A1 | 5/2005 | Plett |
| 2007/0145953 A1 | 6/2007 | Asai et al. |
| 2008/0094035 A1 | 4/2008 | Plett |
| 2010/0174500 A1 | 7/2010 | Plett |
| 2010/0269776 A1 | 10/2010 | Mizuno |
| 2011/0109273 A1* | 5/2011 | Tamezane ............... B60L 58/15 |
| | | 320/132 |
| 2012/0215517 A1 | 8/2012 | Bohlen et al. |
| 2015/0318726 A1 | 11/2015 | Luo et al. |
| 2016/0018471 A1* | 1/2016 | Lee ...................... G01R 31/367 |
| | | 702/63 |
| 2016/0131714 A1 | 5/2016 | Kuusisto et al. |
| 2016/0187429 A1 | 6/2016 | Kawai et al. |
| 2017/0059662 A1 | 3/2017 | Cha et al. |
| 2018/0090962 A1 | 3/2018 | Cha et al. |
| 2019/0067954 A1* | 2/2019 | Ohkawa ................ B60L 58/12 |
| 2019/0178951 A1 | 6/2019 | Cha et al. |
| 2019/0257890 A1 | 8/2019 | Cha et al. |
| 2020/0241074 A1 | 7/2020 | Busser |
| 2020/0271725 A1 | 8/2020 | Herring et al. |

FOREIGN PATENT DOCUMENTS

| | | |
|---|---|---|
| JP | 2007-064871 A | 3/2007 |
| JP | 2007-147487 A | 6/2007 |
| JP | 2010-270747 A | 12/2010 |
| JP | 4722857 B2 | 7/2011 |
| JP | 2016-119728 A | 6/2016 |
| JP | 2016-126999 A | 7/2016 |
| JP | 6068100 B2 | 1/2017 |
| JP | 2018-533338 A | 11/2018 |
| KR | 10-2004-0000991 A | 1/2004 |
| KR | 10-0471233 B1 | 3/2005 |
| KR | 10-1742340 B1 | 5/2017 |
| KR | 10-1798201 B1 | 11/2017 |
| KR | 10-2038610 B1 | 10/2019 |
| KR | 10-2020-0093462 A | 8/2020 |

OTHER PUBLICATIONS

Extended European Search Report issued Nov. 22, 2023 for corresponding European Patent Application No. 21917931.4 (Note: US 2018/0090962 A1 and US 2007/0145953 A1 were cited in a prior IDS.).

Notice of Allowance issued Jan. 9, 2024 for corresponding Japanese Patent Application No. 2022-573257.

* cited by examiner

[FIG. 1]
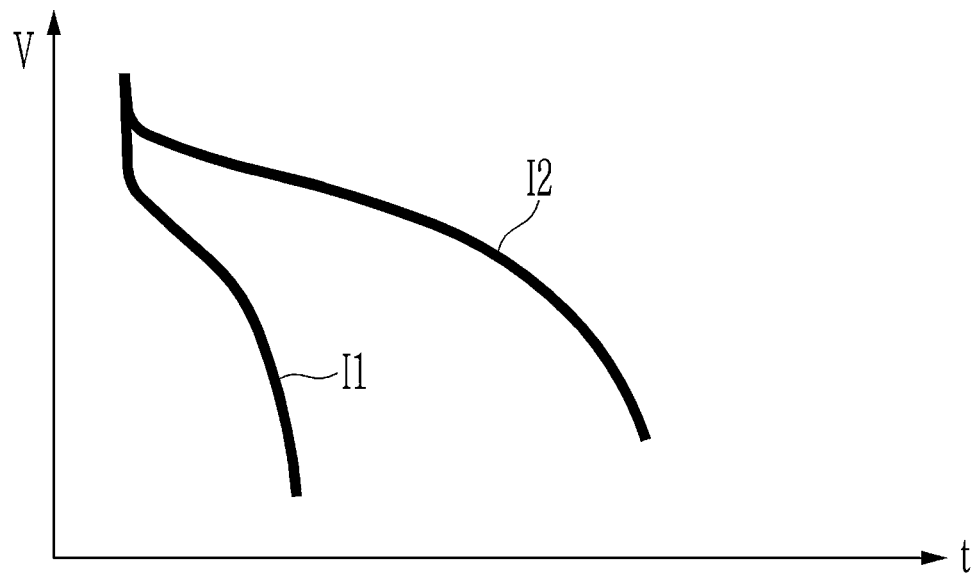
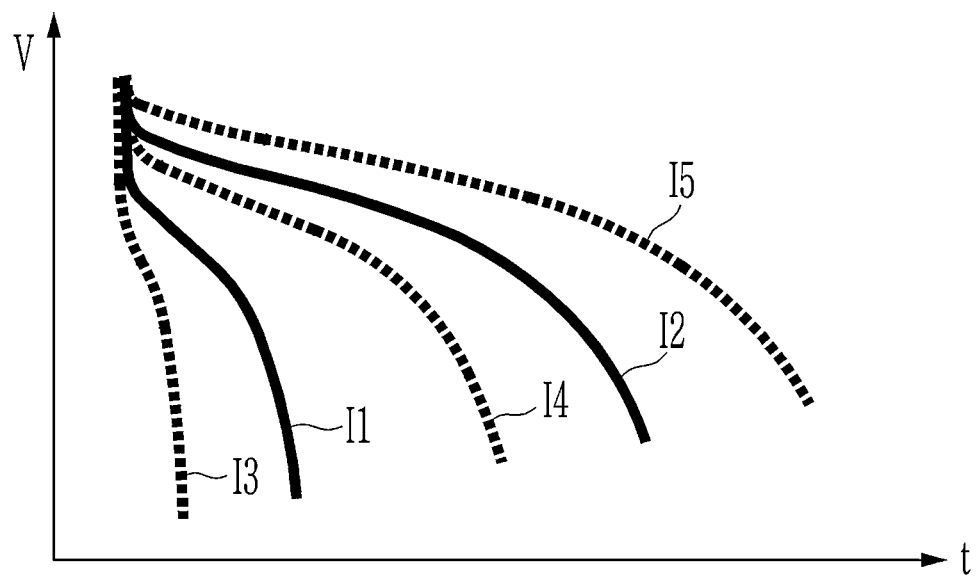

[FIG. 2]
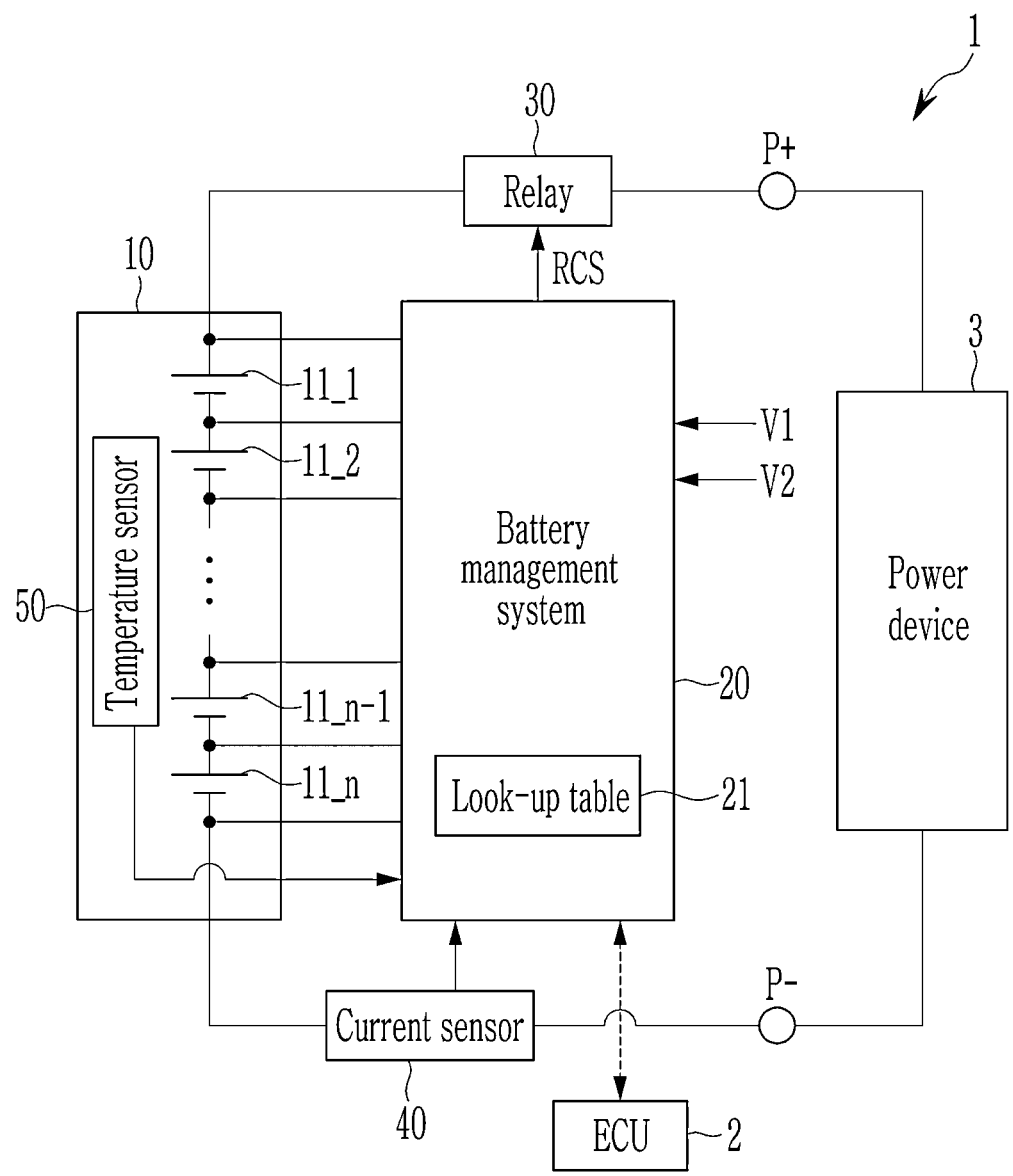

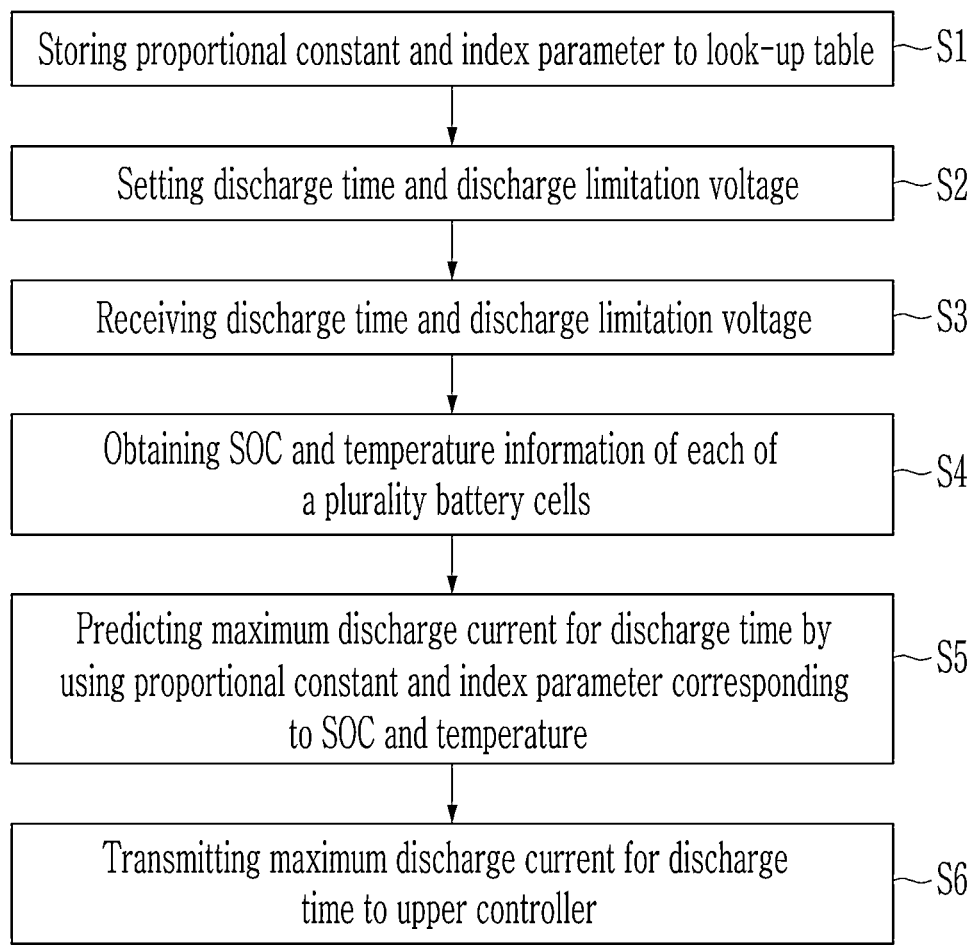
[FIG. 3]

[FIG. 4]
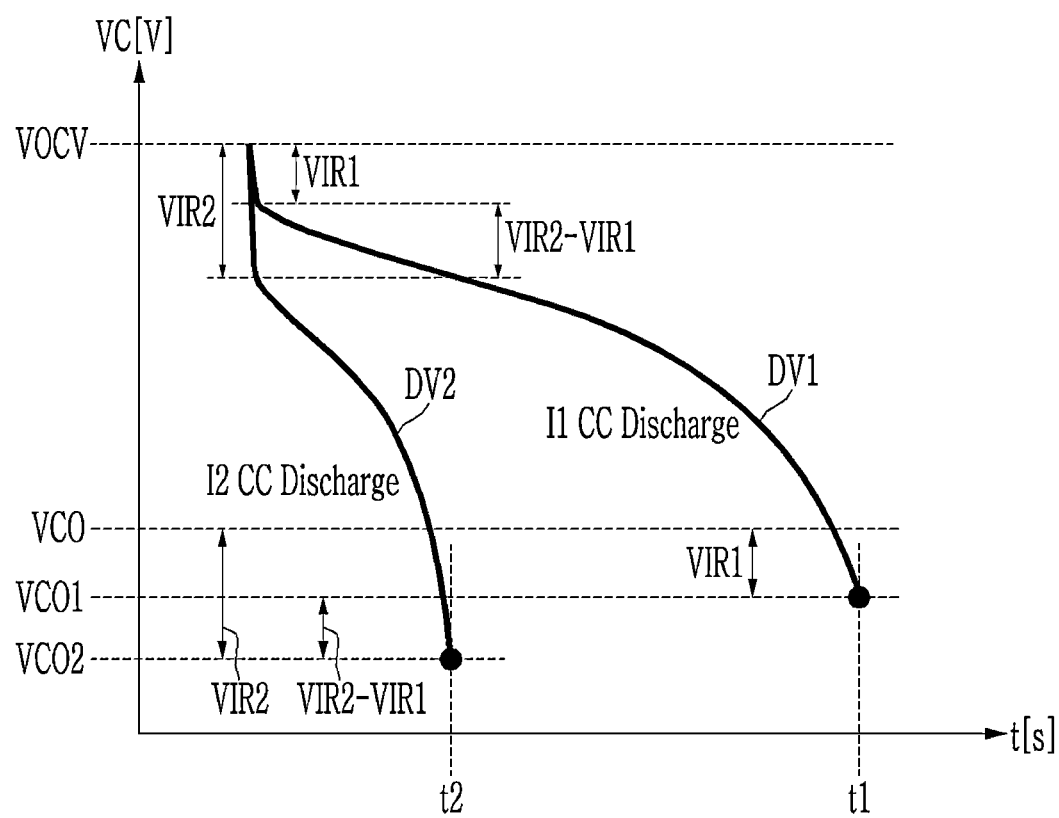

[FIG. 5]
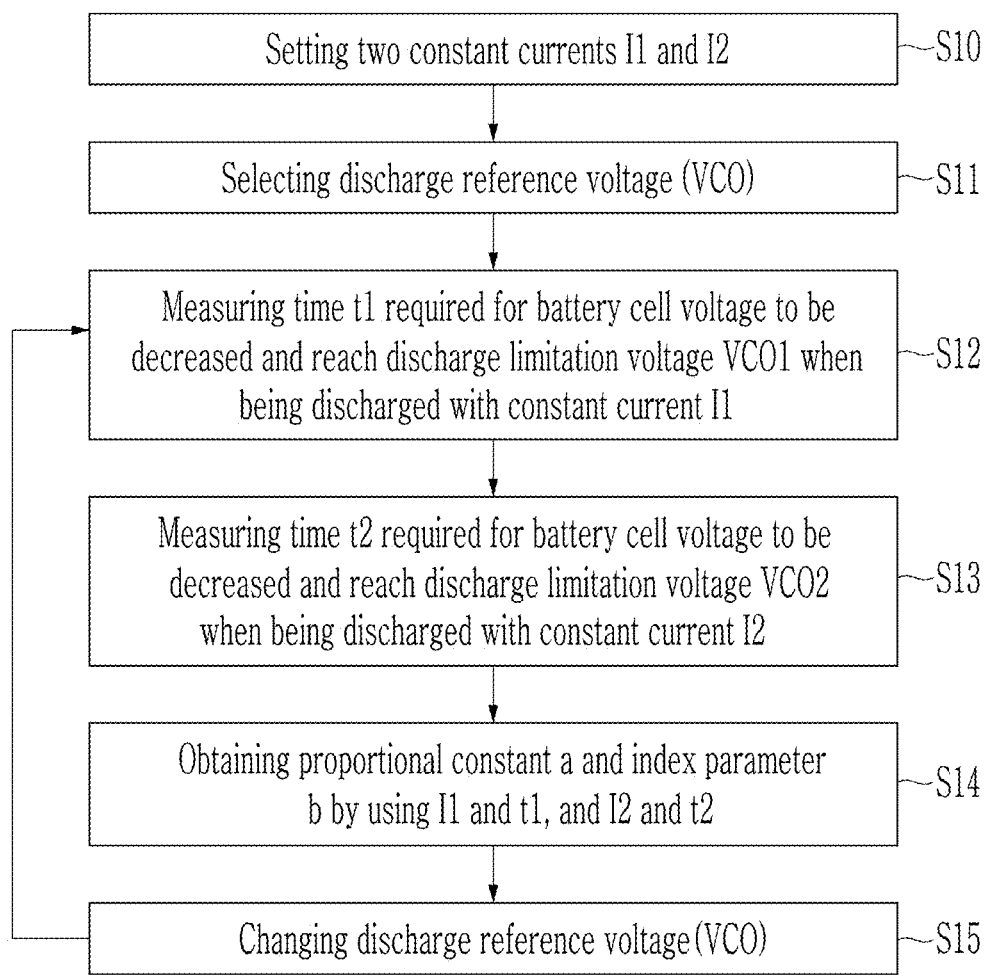

[FIG. 6]
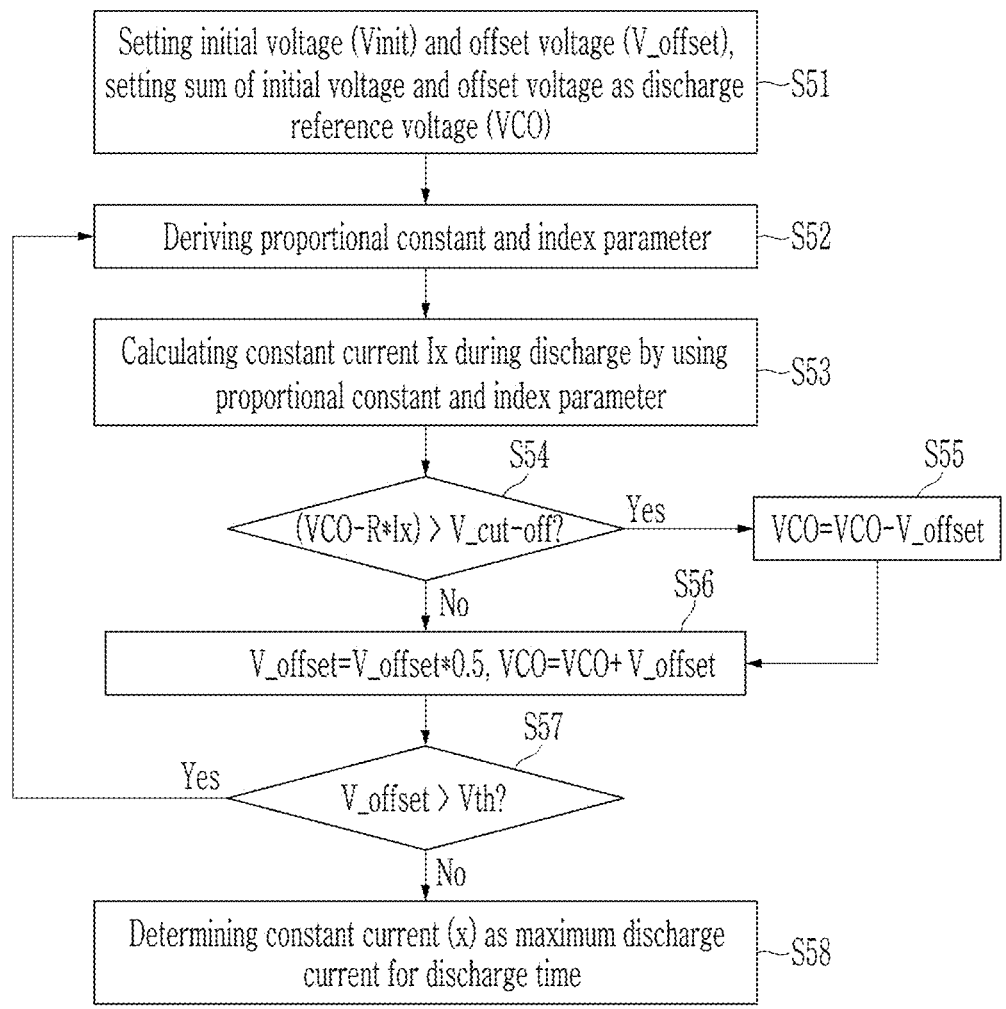

[FIG. 7]
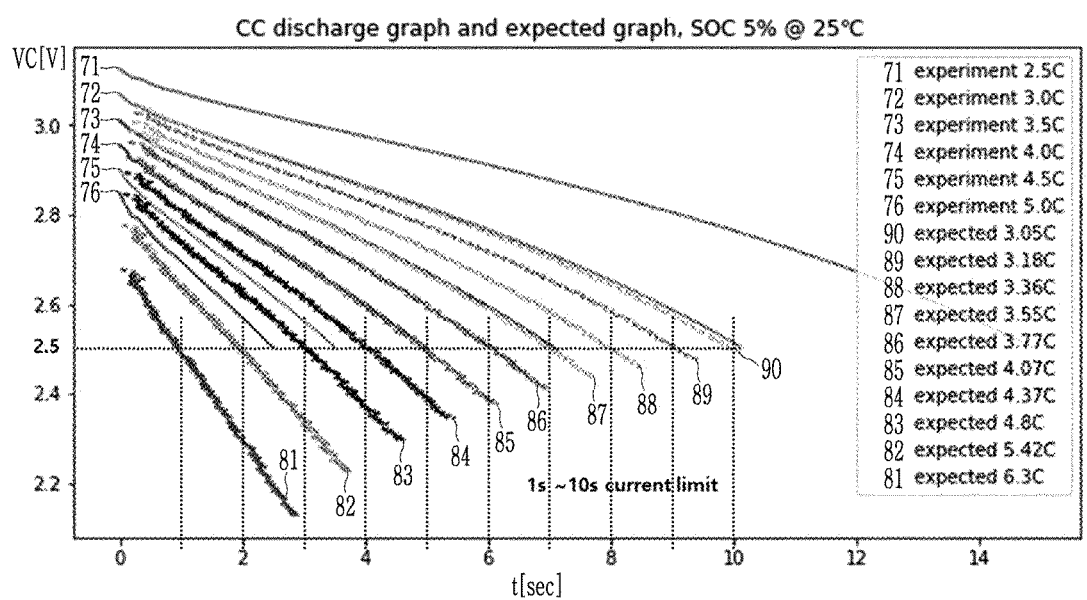

MAXIMUM DISCHARGE CURRENT PREDICTION METHOD AND BATTERY SYSTEM USING THE SAME

CROSS-REFERENCE TO RELATED APPLICATION

This application claims priority to and the benefit of Korean Patent Application No. 10-2021-0002662 filed in the Korean Intellectual Property Office on Jan. 8, 2021, the entire contents of which are incorporated herein by reference.

The present disclosure relates to a maximum discharge current prediction method and a battery system using the same.

TECHNICAL FIELD

Background Art

When using a lithium ion secondary battery, it is very important to find a current at which the lithium ion battery cell reaches a certain voltage after a certain time. If the battery cell is used so that the battery cell voltage is lower than a lower limit voltage, a problem may occur in the safety and cycle-life of the battery cell.

As such, a technique (hereinafter, a maximum discharge current prediction method) for predicting whether the battery cell voltage will reach the discharge limit voltage after how much time when discharging with some current at a specific SOC and temperature is required.

If there is no maximum discharge current prediction method as above, a plurality of discharge times are set by dividing a predetermined discharge time into a predetermined unit, and a plurality of discharge current values for a plurality of SOCs and a plurality of temperatures at each discharge time should be stored in the battery management system. That is, the battery management system stores the above information in the form of a look-up table, and finds the discharge current value corresponding to the current discharge condition from the look-up table when the battery cell is discharged. However, the capacity of the look-up table is very large, and a plurality of discharge experiments must be performed to generate the look-up table, and the experiments take a considerable amount of time.

DISCLOSURE

Technical Problem

The present disclosure is to provide a maximum discharge current prediction method that may predict the maximum discharge current with which a battery cell will reach a discharge limitation voltage after a predetermined discharge period has elapsed at an arbitrary SOC and temperature, and a battery system using the same.

Technical Solution

A method of predicting a maximum discharge current for a battery cell includes: receiving a discharge time and a discharge limitation voltage; setting a discharge reference voltage; obtaining a proportional constant and an index parameter corresponding to the discharge reference voltage, wherein the proportional constant and the index parameter are applied to a relation between a constant current and a discharge time during a discharge; calculating a constant current for the discharge time by using the proportional constant and the index parameter; and adjusting the discharge reference voltage when a difference between a temporary discharge limitation voltage at which a voltage due to the constant current and an internal resistance of the battery cell is dropped from the discharge reference voltage and the discharge limitation voltage deviates from a predetermined error.

The adjusting of the discharge reference voltage may include: subtracting the discharge reference voltage by a predetermined offset voltage when the temporary discharge limitation voltage is greater than the discharge limitation voltage; reducing the offset voltage by a predetermined ratio; and adding the reduced offset voltage to the discharge reference voltage.

The adjusting of the discharge reference voltage may include: reducing the predetermined offset voltage by a predetermined ratio; and adding the reduced offset voltage to the discharge reference voltage when the temporary discharge limitation voltage is not larger than the discharge limitation voltage.

After the adjusting of the discharge reference voltage, calculating the constant current for the discharge time by acquiring the proportional constant and the index parameter corresponding to the discharge reference voltage may be repeatedly performed, and the adjusting of the discharge reference voltage may be repeated when the difference between the temporary discharge limitation voltage based on the constant current calculated by the iteration and the discharge limitation voltage deviates from the predetermined error.

The adjusting of the discharge reference voltage may include: reducing the offset voltage by a predetermined ratio and adding the reduced offset voltage to the discharge reference voltage after subtracting the discharge reference voltage by a predetermined offset voltage when the temporary discharge limitation voltage is greater than the discharge limitation voltage; reducing the predetermined offset voltage by a predetermined ratio; and adding the reduced offset voltage to the discharge reference voltage when the temporary discharge limitation voltage is not larger than the discharge limitation voltage.

The method of predicting the maximum discharge current may further include predicting the calculated constant current when the offset voltage is less than or equal to a predetermined threshold voltage as the maximum discharge current for the discharge time.

The obtaining of the proportional constant and index parameter corresponding to the discharge reference voltage may include selecting the proportional constant and the index parameter corresponding to the discharge reference voltage among a plurality of proportional constants and a plurality of index parameters. A plurality of proportional constants and a plurality of index parameters may be obtained by measuring a first time required for the battery cell voltage to be decreased to the first discharge limitation voltage by a first constant current discharge, measuring a second time required for the battery cell voltage to be decreased to the second discharge limitation voltage by a second constant current discharge, and calculating a proportional constant and an index parameter based on the first constant current and the first time, and the second constant current and the second time, while changing a level of the discharge reference voltage. The first discharge limitation voltage may be a voltage at which the voltage due to the first constant current and the internal resistance of the battery cell is dropped from the discharge reference voltage, and the second discharge limitation voltage is the voltage at which the voltage due to the second constant current and the internal resistance of the battery cell is dropped from the discharge reference voltage.

The obtaining of the proportional constant and the index parameter corresponding to the discharge reference voltage may include selecting the proportional constant and the index parameter according to a SOC and a temperature condition of the battery cell.

A battery system according to another feature of the invention includes: a plurality of battery cells; and a battery management system connected to a plurality of battery cells to estimate a SOC of a plurality of battery cells, to receive information for a temperature of each of a plurality of battery cells, and to receive a discharge time and a discharge limitation voltage from the outside. The battery management system may set a discharge reference voltage, calculate a constant current for the discharge time by using a proportional constant and an index parameter corresponding to the discharge reference voltage, and adjust the discharge reference voltage when a difference between a temporary discharge limitation voltage at which a voltage due to the constant current and an internal resistance of the battery cell is dropped from the discharge reference voltage and the discharge limitation voltage deviates from a predetermined error, and the proportional constant and the index parameter may be applied to a relation between the constant current and the discharge time during the discharge.

The battery management system may reduce the offset voltage by a predetermined ratio, and add the reduced offset voltage to the discharge reference voltage after subtracting the discharge reference voltage by a predetermined offset voltage when the temporary discharge limitation voltage is greater than the discharge limitation voltage.

The battery management system may reduce a predetermined offset voltage by a predetermined ratio and add the reduced offset voltage to the discharge reference voltage when the temporary discharge limitation voltage is not larger than the discharge limitation voltage.

The battery management system, after adjusting the discharge reference voltage, may calculate a constant current for the discharge time by using a proportional constant and an index parameter corresponding to the discharge reference voltage and adjust the discharge reference voltage when a difference between the temporary discharge limitation voltage based on the calculated constant current and the discharge limitation voltage deviates from the predetermined error.

The battery management system may reduce the offset voltage by a predetermined ratio and add the reduced offset voltage to the discharge reference voltage after subtracting the discharge reference voltage by a predetermined offset voltage when the temporary discharge limitation voltage is larger than the discharge limitation voltage, and may reduce the predetermined offset voltage by a predetermined ratio and add the reduced offset voltage to the discharge reference voltage when the temporary discharge limitation voltage is not larger than the discharge limitation voltage.

The battery management system may predict the calculated constant current as a maximum discharge current for the discharge time when the offset voltage is less than a predetermined threshold voltage.

The battery management system may include a look-up table storing a plurality of proportional constants and a plurality of index parameters according to the level of the discharge reference voltage. A plurality of proportional constants and a plurality of index parameters may be obtained by measuring a first time required for the battery cell voltage to be decreased to the first discharge limitation voltage by a first constant current discharge, measuring a second time required for the battery cell voltage to be decreased to the second discharge limitation voltage by a second constant current discharge, and calculating a proportional constant and an index parameter based on the first constant current and the first time, and the second constant current and the second time, while changing a level of the discharge reference voltage. The first discharge limitation voltage may be a voltage at which the voltage due to the first constant current and the internal resistance of the battery cell is dropped from the discharge reference voltage, and the second discharge limitation voltage is the voltage at which the voltage due to the second constant current and the internal resistance of the battery cell is dropped from the discharge reference voltage.

The battery management system may select the proportional constant and the index parameter according to the discharge reference voltage, a SOC, and a temperature condition of the battery cell.

Advantageous Effects

The maximum discharge current prediction method that may predict the maximum discharge current with which the battery cell reaches the discharge limitation voltage after a predetermined discharge period elapses at an arbitrary SOC and temperature, and a battery system using the same, are provided.

BRIEF DESCRIPTION OF THE DRAWINGS

FIG. 1 is a graph for explaining a prediction method according to an embodiment.

FIG. 2 is a view showing a partial configuration of a battery system according to an embodiment and a vehicle equipped with the same.

FIG. 3 is a flowchart showing a method for predicting a maximum discharge current according to an embodiment.

FIG. 4 is a graph for explaining a discharge voltage graph prediction method according to an embodiment.

FIG. 5 is a flowchart showing a method for determining a proportional constant and an index parameter between a constant current and a discharge time according to an embodiment.

FIG. 6 is a flowchart showing a method for predicting a maximum discharge current according to an embodiment.

FIG. 7 is a view showing a prediction discharge voltage graph according to an embodiment and a discharge voltage graph according to an actual experimental result.

MODES FOR INVENTION

The discharge current prediction method according to an embodiment may be applied to a battery management system (BMS). The BMS may receive a request from the vehicle for a maximum discharge current that allows the battery cell voltage to reach the discharge limitation voltage for a predetermined time, and may predict the maximum discharge current that can satisfy the request.

Hereinafter, embodiments disclosed in the present specification will be described in detail with reference to the accompanying drawings. In the present specification, the same or similar components will be denoted by the same or similar reference numerals, and an overlapped description thereof will be omitted. The terms "module" and "unit" for components used in the following description are used only in order to easily make a specification. Therefore, these terms do not have meanings or roles that distinguish them from each other in themselves. Further, in describing embodiments of the present specification, when it is determined that a detailed description of the well-known art associated with the present invention may obscure the gist of the present invention, it will be omitted. In addition, the accompanying drawings are provided only in order to allow embodiments disclosed in the present specification to be easily understood and are not to be interpreted as limiting the spirit disclosed in the present specification, and it is to be understood that the present invention includes all modifications, equivalents, and substitutions without departing from the scope and spirit of the present invention.

Terms including ordinal numbers such as first, second, and the like will be used only to describe various components, and are not interpreted as limiting these components. The terms are only used to differentiate one component from other components.

It is to be understood that when one component is referred to as being "connected" or "coupled" to another component, it may be connected or coupled directly to another component or be connected or coupled to another component with the other component intervening therebetween. On the other hand, it is to be understood that when one component is referred to as being "connected or coupled directly" to another component, it may be connected to or coupled to another component without another component intervening therebetween.

It will be further understood that terms "comprise" and "have" used in the present specification specify the presence of stated features, numerals, steps, operations, components, parts, or a combination thereof, but do not preclude the presence or addition of one or more other features, numerals, steps, operations, components, parts, or a combination thereof.

FIG. 1 is a graph for explaining a prediction method according to an embodiment.

An upper graph of FIG. 1 is a discharge voltage graph obtained through a constant current (CC) discharge experiment. The vertical axis is a battery cell voltage, and the horizontal axis is a discharge time. The two solid line curves are discharge voltage curves when performing the discharge with constant currents I1 and I2. Through the CC discharge experiment using two constant currents I1 and I2, the proportional constant and the index parameter in the relationship between the constant current and the discharge time during the discharge may be obtained.

In the lower graph of FIG. 1, using the obtained proportional constant and index parameter, the discharge voltage graph according to the passage of the discharge time during the CC discharge for the constant currents I3 to I5 for which no experiment was performed is shown as a dotted line. That is, using the obtained proportional constant and index parameter, the discharge voltage graph according to the lapse of the discharge time may be predicted during the CC discharge for the constant currents I3 to I5.

Conventionally, various constant current discharge experiments have been performed to obtain the maximum discharge current for a predetermined discharge period. For the untested constant current discharge, the untested constant current discharge result has been predicted by interpolating the discharge test results using at least two constant currents adjacent to the size of the constant current of the untested constant current discharge. The present invention acquires a proportional constant and an index parameter in the discharge experiment using two constant currents, differently from the prior art, and may predict the maximum discharge current for an arbitrary discharge time using these.

FIG. 2 is a view showing some configuration of a battery system according to an embodiment and a vehicle equipped with the same.

The battery system 1 may be mounted on the vehicle, and may be connected to a power device 3 for generating various power sources necessary to operate the vehicle and charging the battery system 1. An Electronic Control Unit (ECU) 2 that controls the operation of the vehicle may transmit and receive information through CAN communication with the battery management system 20.

The battery system 1 may include the battery 10, the battery management system (BMS) 20, a relay 30, a current sensor 40, and a temperature sensor 50.

The battery 10 includes a plurality of battery cells 11_1 to 11_$n$ (where n is a natural number) connected in series.

The relay 30 is connected between the positive terminal of the battery 10 and an output terminal P+, and opens or closes under the control of the BMS 20. For example, the relay 30 may be closed according to a relay control signal RCS of an on-level received from the BMS 20 and may be opened according to the relay control signal RCS of an off-level. In FIG. 1, only one relay is shown, but this is an example of the present invention but it is not limited thereto. A relay may be further connected between the negative electrode of the battery 10 and the output terminal (−).

The current sensor 40 may sense a current flowing through the battery 10 (hereinafter, a battery current), and the current sensor 40 may transmit a signal indicating the sensed current to the BMS 20.

The temperature sensor 50 is installed inside the battery 10 to measure the temperature of each of a plurality of battery cells 11_1 to 11_$n$. The temperature sensor 50 may transmit a signal indicating the measured temperatures of a plurality of battery cells 11_1 to 11_$n$ to the BMS 20.

The BMS 20 may be connected to a plurality of battery cells 11_1 to 11_$n$ to measure the cell voltage of a plurality of battery cells 11_1 to 11_$n$ and the voltage of the battery 10, to receive the information for the battery current and the temperature of a plurality of battery cells 11_1 to 11_$n$, to control the charge and discharge current of the battery 10 based on the cell voltage of a plurality of battery cells 11_1 to 11_$n$, the battery current, etc., and to control a cell balancing operation for a plurality of battery cells 11_1 to 11_$n$.

The BMS 20 controls the opening and closing of the relay 30 to control the charge and discharge of the battery 10. The BMS 20 may generate and supply the control signal RCS that controls the opening and closing of the relay 30.

The BMS 20 may estimate a SOC (State of Charge) of each of a plurality of battery cells 11_1 to 11_$n$ based on a plurality of battery cell voltages and the battery current, and the battery cell temperature, and estimate an internal resistance of each of a plurality of battery cells 11_1 to 11_$n$. The method for estimating the SOC and internal resistance is a known technique, and various methods may be applied to the present invention.

The BMS 20 receives a request from the ECU 2 for the discharge current that allows the battery cell voltage to reach the discharge limitation voltage at a predetermined discharge time, and predicts the discharge current that may satisfy the request. The BMS 20 may store a look-up table 21 in which the proportional constant and index parameters are recorded for each SOC and cell temperature.

Hereinafter, the discharge current prediction method of the BMS 20 according to an embodiment is described in detail.

FIG. 3 is a flowchart showing a method for predicting a maximum discharge current according to an embodiment.

First, a discharge test is performed using each of two constant currents I1 and I2 for each SOC and temperature condition. The result data obtained from the experiment performed in this way may include the proportional constant and index parameter in the relationship between the constant current and the discharge time during the discharge, and may be stored in the look-up table 21 of the BMS 20 (51).

An upper controller of the vehicle equipped with the battery system 1 sets a discharge time Dt and a discharge limitation voltage V_cut-off (S2). The discharge time Dt refers to the time required for the battery cell voltage to reach the discharge limitation voltage from the start of the discharge, and the discharge limitation voltage refers to the minimum voltage at which the battery cell voltage may decrease during the discharge. If the battery cell is discharged to the voltage at which the battery cell voltage is lower than the discharge limitation voltage, the battery cell may be damaged.

The BMS 20 receives the discharge time Dt and the discharge limitation voltage V_cut-off from the upper controller (S3).

For example, the ECU 2 may set the discharge time Dt and the discharge limitation voltage V_cut-off, and transmit them to the BMS 20 through the CAN communication, and the BMS 20 may receive the discharge time Dt and the discharge limitation voltage V_cut-off.

The BMS 20 acquires the SOC and temperature information of each of a plurality of battery cells (S4). The BMS 20 may receive a signal indicating the temperature of each of a plurality of battery cells 11_1 to 11_n from the temperature sensor 50 to obtain the temperature information and estimate the SOC of each of a plurality of battery cells 11_1 to 11_n based on the battery current, the cell voltage, and the temperature of each of a plurality of battery cells 11_1 to 11_n.

The BMS 20 derives the proportional constant and index parameter corresponding to the SOC and temperature of each of a plurality of battery cells 11_1 to 11_n from the look-up table 21, and predicts the constant current at which the cell voltage reaches the discharge limitation voltage when the constant current discharge is performed during the discharge time Dt by using the derived proportional constant and index parameter (S5). Hereinafter, the constant current predicted by the step (S5) is referred to as the maximum discharge current for the discharge time Dt.

The BMS 20 transmits the maximum discharge current for the discharge time Dt to the upper controller, for example, the ECU 2, through the CAN communication S6.

Hereinafter, a method for calculating the proportional constant and the index parameter in the relationship between the discharge current and the discharge time according to an embodiment is described.

FIG. 4 is a graph for explaining a discharge voltage graph prediction method according to an embodiment.

In FIG. 4, when the discharge is performed with different constant currents at a predetermined start SOC (State Of Charge) and a predetermined start temperature condition for the same battery cell, the change of the battery cell voltage according to the lapse of the time is shown.

First, in FIG. 4, the discharge voltage graph DV1 is a graph showing the change in the battery cell voltage VC when discharging with the constant current I1, and the discharge voltage graph DV2 is a graph showing the change in the battery cell voltage VC when discharging with the constant current I2.

In FIG. 4, "VCO" may be arbitrarily selected as a discharge reference voltage when the discharge current is zero. "VCO1" is a voltage (VCO–VIR1) obtained by subtracting the voltage drop (VIR1=R*I1) from the discharge reference voltage (VCO) when the constant current I1 flows through the battery cell, and "VCO2" is the voltage (VCO–VIR2) obtained by subtracting the voltage drop (VIR2=R*I2) from the discharge reference voltage (VCO) when the constant current I2 flows through the battery cell. That is, VCO1 is the discharge limitation voltage when the discharge current is I1, and VOC2 is the discharge limitation voltage when the discharge current is I2. When the CC discharge is performed under the condition of the same starting SOC and starting temperature, VCO1, VCO2, and VCO have the relationship as shown in Equation 1.

$$VCO1+R*I1=VCO2+R*I2=VCO \quad \text{[Equation 1]}$$

As shown in FIG. 4, when the discharge starts, the battery cell voltage VC rapidly decreases from the open circuit voltage (OCV) VOCV by the voltage drop caused by the corresponding constant current and the resistance of the battery cell, and then decreases according to the lapse of the time. The battery cell voltage decreases at the start of the discharge by the voltage drop R*I1 due to the constant current I1 and the battery cell resistance R, and as the time elapses, the battery cell voltage decreases and reaches the discharge limitation voltage VCO1 when the time t1 elapses. The battery cell voltage decreases at the start of the discharge by the voltage drop R*I2 due to the constant current I2 and the battery cell resistance R, and as the time elapses, the battery cell voltage decreases and reaches the discharge limitation voltage VCO2 when the time t2 elapses.

The relationship between the constant current "I" and the discharge time "t" when the battery cell is discharged satisfies Equation 2 below.

$$I=a*t^b \quad \text{[Equation 2]}$$

In Equation 2, "a" and "b" are the proportional constant and the index parameters between the constant current and the discharge time during the discharge.

If Equation 2 is summarized with respect to time, it is as Equation 3.

$$t=\left(\frac{I}{a}\right)^{\frac{1}{b}} \quad \text{[Equation 3]}$$

FIG. 5 is a flowchart showing a method for determining a proportional constant and an index parameter between a constant current and a discharge time according to an embodiment.

First, two constant currents I1 and I2 are set (S10).

Next, the discharge reference voltage VCO is selected (S11).

When discharging to the constant current I1, the time t1 required to reach the discharge limitation voltage VCO1 as the battery cell voltage (VC) decreases is measured (S12).

Then, when discharging to the constant current I2, the time t2 required to reach the discharge limitation voltage VCO2 as the battery cell voltage VC decreases is measured (S13).

Two simultaneous equations are obtained by substituting I1, t1, I2, and t2 obtained through the step (S12) and the step (S13) into Equation 2, and the proportional constant "a" and the index parameter "b" are obtained by solving two simultaneous equations (S14).

The discharge reference voltage VCO is changed (S15) and the steps (S12 to S15) are repeated.

As described above, while changing the discharge reference voltage VCO, the proportional constant and the index parameter are acquired for each discharge reference voltage VCO. In addition, while changing the SOC and temperature conditions, according to the method shown in FIG. 5, the proportional constant and index parameter for each discharge reference voltage VCO are obtained. The proportional constant and index parameter obtained in the above manner are stored in the look-up table 21 for each discharge reference voltage VCO for a plurality of SOC and temperature conditions.

Hereinafter, a method of predicting the maximum discharge current for the discharge time Dt according to an embodiment is described with reference to FIG. 6.

FIG. 6 is a flowchart showing a method for predicting a maximum discharge current according to an embodiment.

The BMS 20 sets an initial voltage Vinit and an offset voltage V_offset, and sets the sum of the initial voltage Vinit and the offset voltage V_offset as the discharge reference voltage VCO (S51).

The BMS 20 derives the proportional constant and index parameter corresponding to the SOC and temperature obtained in the step (S4), and the discharge reference voltage predetermined in the step (S51) in the look-up table 21 (S52).

The BMS 20 calculates the constant current Ix during the discharge by substituting the proportional constant and index parameter derived from the step (S52) and the discharge time Dt received from the step (S3) into Equation 2 (S53).

The BMS 20 determines whether the voltage (VCO−R*Ix) obtained by subtracting the voltage drop (R*Ix) due to the constant current Ix and the internal resistance R of the battery cell from the discharge reference voltage VCO is larger than the discharge limitation voltage V_cut-off (S54). Hereinafter, the voltage obtained by subtracting the voltage drop (R*Ix) due to the constant current Ix and the internal resistance R of the battery cell from the discharge reference voltage VCO is referred to as a temporary discharge limitation voltage (VCO−R*Ix).

As a result of the determination of the step (S54), if the temporary discharge limitation voltage (VCO−R*Ix) is greater than the discharge limitation voltage (x), the BMS subtracts the offset voltage V_offset from the discharge reference voltage VCO (S55). The step (S55) is followed by the step (S56).

As a result of the determination of the step (S54), if the temporary discharge limitation voltage (VCO−R*Ix) is not greater than the discharge limitation voltage (x), the BMS 20 changes the offset voltage V_offset by multiplying the offset voltage V_offset by a predetermined ratio (e.g., 0.5), and adds the offset voltage V_offset to the discharge reference voltage VCO (S56).

The BMS 20 determines whether the offset voltage V_offset is greater than a predetermined threshold voltage Vth (S57).

As a result of the determination of the step (S57), if the offset voltage V_offset is not larger than the threshold voltage Vth, the BMS 20 determines the constant current Ix calculated in the step (S53) as the maximum discharge current for the discharge time Dt (S58).

As a result of the determination of the step (S57), if the offset voltage V_offset is larger than the threshold voltage Vth, the BMS 20 repeats from the step (S52) for the discharge reference voltage VCO changed in the step (S56).

That is, in predicting the maximum discharge current for the discharge time Dt shown in FIG. 6, the constant current Ix when a difference between the temporary discharge limitation voltage to which the voltage is dropped due to the constant current Ix and the internal resistance R of the battery cell from the discharge reference voltage VCO, and the discharge limitation voltage V_cut-off belongs to a predetermined error, is predicted as the maximum discharge current. As the predetermined error is set smaller, the temporary discharge limitation voltage approaches the discharge limitation voltage V_cut-off. That is, as the threshold voltage is decreased, the offset voltage is lowered and the discharge reference voltage VCO is more finely adjusted, then, the temporary discharge limitation voltage is also finely adjusted, so that it may be closer to the discharge limitation voltage V_cut-off. However, as the steps S52 to S57 are repeated, the amount of computation and the computation time of the BMS 20 increases. Therefore, the threshold voltage may be appropriately set in consideration of the amount of the computation and the allowable error margin that are performed to predict the maximum discharge current.

FIG. 7 is a view showing a prediction discharge voltage graph according to an embodiment and a discharge voltage graph according to an actual experimental result.

The discharge voltage graphs shown in FIG. were obtained by the discharge experiment performed at the SOC 5% and 25° C. conditions, and the maximum discharge currents were predicted under the same conditions.

A solid line graph in FIG. 7 is a discharge voltage graph 71-76 according to the actual discharge test result for each discharge current, that is, each constant current of 2.5 C, 3.0 C, 3.5 C, 4.0 C, 4.5 C, and 5.0 C.

When the discharge limitation voltage is 2.5 V, based on the discharge voltage graph 76 by the 5.0 C constant current and the discharge voltage graph 75 by the 4.5 C constant current shown in FIG. 7, the proportional constant and the index parameter between the constant current and the discharge time are obtained.

According to the discharge current prediction method according to an embodiment, the maximum discharge current for each discharge time of 1 to 10 seconds (divided into a 1 second units) may be predicted by using the obtained proportional constant and index parameter. FIG. 7 shows ten discharge voltage curves 81 to 90 according to the predicted maximum discharge current.

For example, the predicted maximum discharge current is 6.3 C and the discharge voltage graph is "81" for 1 second of the discharge time, the predicted maximum discharge current is 5.42 C and the discharge voltage graph is "82" for 2 seconds of the discharge time, the predicted maximum discharge current is 4.8 C and the discharge voltage graph is "83" for 3 seconds of the discharge time, the predicted maximum discharge current is 4.37 C and the discharge voltage graph is "84" for 4 seconds of the discharge time, the predicted maximum discharge current is 4.07 C and the discharge voltage graph is "85" for 5 seconds of the discharge time 5, the predicted maximum discharge current is 3.77 C and the discharge voltage graph is "86" for 6 seconds of the discharge time, the predicted maximum discharge current is 3.55 C and the discharge voltage graph is "87" for 7 seconds of the discharge time 7, the predicted maximum discharge current is 3.36 C and the discharge voltage graph is "88" for 8 seconds of the discharge time 8, the predicted maximum discharge current is 3.18 C and the discharge voltage graph is "89" for 9 seconds of the discharge time, and the predicted maximum discharge current is 3.05 C and the discharge voltage graph is "90" for 10 seconds of the discharge time.

In FIG. 7, the discharge voltage curve 76 depending on the constant current of C according to the experiment is positioned between the discharge voltage curve 83 depending on the predicted maximum discharge current of 4.8 C for the discharge time of 3 seconds and the discharge voltage curve 82 depending on a predicted maximum discharge current of 5.42 C for the discharge time of 2 seconds. Also, the discharge voltage curve 75 depending on the constant current of 4.5 C according to the experiment is positioned between the discharge voltage curve 83 depending on the predicted maximum discharge current of 4.8 C for the discharge time of 3 seconds and the discharge voltage curve 84 depending on the predicted maximum discharge current of 4.37 C for the discharge time of 4 seconds. That is, it may be seen that the arrangement between the discharge voltage curves according to the prediction result and the discharge voltage curves according to the experiment is properly arranged in the order of the constant current and the maximum discharge current.

As such, through the present invention, as a result of the CC discharge with two currents, the maximum discharge current prediction for an arbitrary discharge time (x seconds) is possible, so it is possible to reduce the number of experiments to obtain the maximum discharge current. In addition, when the maximum discharge current for the discharge time (x seconds) is requested in the vehicle, the BMS may predict in real time to provide the maximum discharge current.

The conventional art had to perform various CC discharge experiments in order to acquire the maximum discharge current for each discharge time, and the maximum discharge current for the non-experimented discharge time was predicted by interpolating the experimental result. For this, the BMS must have a look-up table that stores the maximum discharge current according to the SOC and temperature for each discharge time. The present invention, unlike the conventional art, only needs to store the information about the proportional constant and index parameter. In the present invention, when the request for the maximum discharge current for the discharge time is received from the vehicle, which is the upper controller, it may be calculated in real time and provided to the upper controller.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

The invention claimed is:

1. A method of predicting a maximum discharge current for a battery cell, the method comprising:
   receiving a discharge time and a discharge limitation voltage for the battery cell;
   setting a discharge reference voltage for the battery cell;
   obtaining a proportional constant and an index parameter corresponding to the discharge reference voltage;
   calculating a constant current for the discharge time by applying the proportional constant and the index parameter to a relation between the constant current and the discharge time during a discharge;
   adjusting the discharge reference voltage in response to determining that a temporary discharge limitation voltage is greater than the discharge limitation voltage, the temporary discharge limitation voltage being a voltage reduced from the discharge reference voltage due to the constant current and an internal resistance of the battery cell;
   predicting the maximum discharge current for the discharge time based on the constant current for the discharge time; and
   controlling an operation of a vehicle by a controller based on the predicted maximum discharge current.

2. The method of claim 1, wherein the adjusting of the discharge reference voltage includes, if the temporary discharge limitation voltage is greater than the discharge limitation voltage:
   reducing the discharge reference voltage by a predetermined offset voltage;
   reducing the predetermined offset voltage by a predetermined ratio; and
   adding the reduced offset voltage to the reduced discharge reference voltage.

3. The method of claim 1, wherein the adjusting of the discharge reference voltage includes:
   reducing a predetermined offset voltage by a predetermined ratio and adding the reduced offset voltage to the discharge reference voltage, if the temporary discharge limitation voltage is not larger than the discharge limitation voltage.

4. The method of claim 1, wherein the adjusting of the discharge reference voltage includes:
   if the temporary discharge limitation voltage is greater than the discharge limitation voltage, reducing the discharge reference voltage by a predetermined offset voltage, reducing the predetermined offset voltage by a predetermined ratio, and adding the reduced offset voltage to the reduced discharge reference voltage; and
   if the temporary discharge limitation voltage is not larger than the discharge limitation voltage, reducing the predetermined offset voltage by the predetermined ratio and adding the reduced offset voltage to the discharge reference voltage.

5. The method of claim 4, further comprising:
   after the adjusting of the discharge reference voltage, determining whether the reduced offset voltage is greater than a predetermined threshold voltage; and
   if the reduced offset voltage is greater than the predetermined threshold voltage:
      calculating an adjusted constant current for the discharge time by applying a proportional constant and an index parameter corresponding to the adjusted discharge reference voltage; and
      repeating the adjusting of the discharge reference voltage.

6. The method of claim 4, further comprising:
   predicting the calculated constant current as the maximum discharge current for the discharge time if the reduced offset voltage is less than or equal to a predetermined threshold voltage.

7. The method of claim 1, wherein the obtaining of the proportional constant and the index parameter corresponding to the discharge reference voltage includes:
   selecting the proportional constant and the index parameter according to a state of charge (SOC) and a temperature condition of the battery cell.

8. A method of predicting a maximum discharge current for a battery cell, the method comprising:

receiving a discharge time and a discharge limitation voltage for the battery cell;

setting a discharge reference voltage for the battery cell;

obtaining a proportional constant and an index parameter corresponding to the discharge reference voltage;

calculating a constant current for the discharge time by applying the proportional constant and the index parameter to a relation between the constant current and the discharge time during a discharge; and adjusting the discharge reference voltage based on whether a temporary discharge limitation voltage is greater than the discharge limitation voltage, the temporary discharge limitation voltage being a voltage reduced from the discharge reference voltage due to the constant current and an internal resistance of the battery cell, wherein:

the obtaining of the proportional constant and index parameter corresponding to the discharge reference voltage includes selecting the proportional constant and the index parameter corresponding to the discharge reference voltage among a plurality of proportional constants and a plurality of index parameters;

each of the plurality of proportional constants and each of the plurality of index parameters is obtained, for a corresponding one of a plurality of levels of the discharge reference voltage, by measuring a first discharge time required for a voltage of the battery cell to be decreased to a first discharge limitation voltage by a first constant discharge current, measuring a second discharge time required for the voltage of the battery cell to be decreased to a second discharge limitation voltage by a second constant discharge current discharge, and calculating the proportional constant and the index parameter based on the first constant discharge current and the first discharge time and on the second constant discharge current and the second discharge time; and the first discharge limitation voltage is a voltage obtained by subtracting a first voltage drop due to the first constant discharge current and the internal resistance of the battery cell from the discharge reference voltage, and the second discharge limitation voltage is a voltage obtained by subtracting a second voltage drop due to the second constant discharge current and the internal resistance of the battery cell from the discharge reference voltage.

9. A battery system, comprising:

a plurality of battery cells; and a battery management system connected to the plurality of battery cells to estimate a state of charge (SOC) of the plurality of battery cells, to receive information for a temperature of each of the plurality of battery cells, and to receive a discharge time and a discharge limitation voltage from an external source, wherein the battery management system is configured to:

set a discharge reference voltage;

calculate a constant current for the discharge time by applying a proportional constant and an index parameter corresponding to the discharge reference voltage to a relation between the constant current and the discharge time during a discharge; and adjust the discharge reference voltage based on whether a temporary discharge limitation voltage is greater than the discharge limitation voltage, the temporary discharge limitation voltage being a voltage reduced from the discharge reference voltage due to the constant current and an internal resistance of the plurality of battery cells.

10. The battery system of claim 9, wherein:

the battery management system is further configured, if the temporary discharge limitation voltage is greater than the discharge limitation voltage, to reduce the discharge reference voltage by a predetermined offset voltage, to reduce the predetermined offset voltage by a predetermined ratio, and to add the reduced offset voltage to the reduced discharge reference voltage.

11. The battery system of claim 9, wherein:

the battery management system is further configured to reduce a predetermined offset voltage by a predetermined ratio and to add the reduced offset voltage to the discharge reference voltage, if the temporary discharge limitation voltage is not larger than the discharge limitation voltage.

12. The battery system of claim 9, wherein the battery management system is further configured to;

if the temporary discharge limitation voltage is larger than the discharge limitation voltage, reduce the discharge reference voltage by a predetermined offset voltage, reduce the predetermined offset voltage by a predetermined ratio, and add the reduced offset voltage to the reduced discharge reference voltage; and if the temporary discharge limitation voltage is not larger than the discharge limitation voltage, reduce the predetermined offset voltage by a predetermined ratio and add the reduced offset voltage to the discharge reference voltage.

13. The battery system of claim 12, wherein:

the battery management system is further configured, after adjusting the discharge reference voltage, to:

determine whether the reduced offset voltage is greater than a predetermined threshold voltage; and if the reduced offset voltage is greater than the predetermined threshold voltage, calculate an adjusted constant current for the discharge time by using a proportional constant and an index parameter corresponding to the adjusted discharge reference voltage, and further adjust the discharge reference voltage.

14. The battery system of claim 12, wherein:

the battery management system is further configured to predict the calculated constant current as a maximum discharge current for the discharge time if the reduced offset voltage is less than a predetermined threshold voltage.

15. The battery system of claim 9, wherein:

the battery management system includes a look-up table storing a plurality of proportional constants and a plurality of index parameters respectively corresponding to a plurality of levels of the discharge reference voltage;

each of the plurality of proportional constants and each of the plurality of index parameters are preset, for a corresponding one of the plurality of levels of the discharge reference voltage, based on:

a measurement of a first discharge time required for a voltage of the plurality of battery cells to be decreased to a first discharge limitation voltage by a first constant discharge current, a measurement of a second discharge time required for the voltage of the plurality of battery cells to be decreased to a second discharge limitation voltage by a second constant discharge current, and a calculation of the proportional constant and the index parameter based on the first constant discharge current and the first discharge time and on the second constant discharge current and the second discharge time; and the first discharge limitation voltage is a voltage obtained by subtracting a first voltage drop due to the first constant discharge current and the internal resistance of the plurality of battery cells from the discharge reference voltage, and the second discharge limitation voltage is a voltage obtained by subtracting a second voltage drop due to the second constant discharge current and the internal resistance of the plurality of battery cells from the discharge reference voltage.

16. The battery system of claim 9, wherein:

the battery management system is further configured to select the proportional constant and the index parameter according to the discharge reference voltage, a SOC, and a temperature condition of the plurality of battery cells.

* * * * *